US011764321B2

(12) United States Patent
Van Duijnhoven

(10) Patent No.: US 11,764,321 B2
(45) Date of Patent: Sep. 19, 2023

(54) BACKSHEET COMPRISING A POLYOLEFINE BASED FUNCTIONAL LAYER FACING THE BACK ENCAPSULANT

(71) Applicant: ENDURANCE SOLAR SOLUTIONS B.V., Geleen (NL)

(72) Inventor: Franciscus Gerardus Henricus Van Duijnhoven, Echt (NL)

(73) Assignee: ENDURANCE SOLAR SOLUTIONS B.V., Geleen (NL)

( * ) Notice: Subject to any disclaimer, the term of this patent is extended or adjusted under 35 U.S.C. 154(b) by 292 days.

(21) Appl. No.: 16/347,909

(22) PCT Filed: Nov. 13, 2017

(86) PCT No.: PCT/EP2017/079063
§ 371 (c)(1),
(2) Date: May 7, 2019

(87) PCT Pub. No.: WO2018/087366
PCT Pub. Date: May 17, 2018

(65) Prior Publication Data
US 2019/0296167 A1  Sep. 26, 2019

(30) Foreign Application Priority Data
Nov. 11, 2016  (EP) ...................... 16198384

(51) Int. Cl.
*H01L 31/049* (2014.01)
*B32B 7/12* (2006.01)
*B32B 27/32* (2006.01)
*C08K 3/22* (2006.01)
*C08K 3/30* (2006.01)
*C08K 3/34* (2006.01)
*C08K 3/40* (2006.01)
*C08L 23/08* (2006.01)
*C08L 23/12* (2006.01)
*C08L 51/06* (2006.01)
*C08L 67/02* (2006.01)

(52) U.S. Cl.
CPC ............. *H01L 31/049* (2014.12); *B32B 7/12* (2013.01); *B32B 27/32* (2013.01); *C08K 3/22* (2013.01); *C08K 3/30* (2013.01); *C08K 3/34* (2013.01); *C08K 3/40* (2013.01); *C08L 23/0815* (2013.01); *C08L 23/0853* (2013.01); *C08L 23/0869* (2013.01); *C08L 23/12* (2013.01); *C08L 51/06* (2013.01); *C08L 67/02* (2013.01); *B32B 2457/12* (2013.01); *C08K 2003/2237* (2013.01); *C08K 2003/3045* (2013.01); *C08L 2203/204* (2013.01); *Y02E 10/50* (2013.01)

(58) Field of Classification Search
CPC ..................................................... H01L 31/049
See application file for complete search history.

(56) References Cited

U.S. PATENT DOCUMENTS

| 2008/0053512 | A1* | 3/2008 | Kawashima | .......... H01L 31/049 |
| | | | | 136/244 |
| 2010/0108128 | A1* | 5/2010 | Chu | .............. B32B 27/306 |
| | | | | 136/252 |
| 2011/0108094 | A1* | 5/2011 | Nishijima | .......... H01L 31/0481 |
| | | | | 136/251 |
| 2011/0146762 | A1* | 6/2011 | Temchenko | ............ B32B 27/30 |
| | | | | 136/251 |
| 2011/0303263 | A1* | 12/2011 | Corfias-Zuccalli | ........................ |
| | | | | C09J 123/0869 |
| | | | | 136/251 |
| 2012/0006407 | A1* | 1/2012 | Takanashi | ............. B32B 27/308 |
| | | | | 136/259 |
| 2012/0048354 | A1* | 3/2012 | Sato | .................... C08L 23/0815 |
| | | | | 136/251 |

(Continued)

FOREIGN PATENT DOCUMENTS

| CN | 101615635 | 12/2009 |
| CN | 102324440 | 1/2012 |
| CN | 102569452 A | 7/2012 |
| CN | 102 738 275 | 10/2012 |
| CN | 103158312 A | 6/2013 |
| CN | 103715287 | 4/2014 |
| CN | 103715287 A | 4/2014 |
| EP | 1938967 | 7/2008 |
| EP | 2277694 | 1/2011 |
| JP | 2012039086 A | 2/2012 |
| JP | 2013021214 A | 1/2013 |

(Continued)

OTHER PUBLICATIONS

International Search Report for PCT/EP2017/079063 dated Feb. 12, 2018, 3 pages.

(Continued)

*Primary Examiner* — Liam J Heincer
(74) *Attorney, Agent, or Firm* — NIXON & VANDERHYE P.C.

(57) ABSTRACT

The present invention relates to a solar cell backsheet, comprising a functional layer wherein the functional layer comprises a polyethylene alloy and a semi-crystalline polymer such as polypropylene, preferably at least 10 wt % of polypropylenes based on the total weight of the polymers in the functional layer. The polypropylene is selected from a polypropylene homo- or copolymer, the copolymer is a random or block copolymer. The polyethylene alloy comprises a copolymer containing an ethylene segment (—CH2-CH2-) which is selected from one or more of ethylene acrylate copolymer, ethylene-hexene copolymer, ethylene-octene copolymer, ethylene-vinyl acetate copolymer. The functional layer further comprises an inorganic filler selected from one of calcium carbonate, titanium dioxide, barium sulfate, mica, talc, kaolin, glass microbeads and glass fibers. The present invention also relates to a photovoltaic module comprising the backsheet according to the present invention.

11 Claims, No Drawings

(56) References Cited

U.S. PATENT DOCUMENTS

| | | | |
|---|---|---|---|
| 2012/0073631 A1* | 3/2012 | Ikenaga | C08F 255/02 |
| | | | 136/251 |
| 2012/0111407 A1* | 5/2012 | Rummens | B32B 15/08 |
| | | | 136/259 |
| 2013/0209795 A1 | 8/2013 | Liu | |
| 2013/0209816 A1 | 8/2013 | Kobayashi | |
| 2013/0269776 A1* | 10/2013 | Wu | C08F 255/02 |
| | | | 136/256 |
| 2014/0000681 A1* | 1/2014 | Zhao | H01L 31/0481 |
| | | | 136/251 |
| 2014/0041716 A1 | 2/2014 | Kang | |
| 2014/0048125 A1* | 2/2014 | Fu | H01L 31/049 |
| | | | 136/251 |
| 2014/0144488 A1 | 5/2014 | Okuyama | |
| 2014/0144499 A1* | 5/2014 | Huang | B32B 27/38 |
| | | | 136/256 |
| 2014/0174509 A1* | 6/2014 | Bonekamp | B29C 41/32 |
| | | | 136/251 |
| 2014/0373915 A1* | 12/2014 | Saito | H01L 31/0481 |
| | | | 136/256 |
| 2015/0114452 A1* | 4/2015 | Solis | C08L 23/0815 |
| | | | 136/251 |
| 2015/0311368 A1 | 10/2015 | Libert et al. | |
| 2015/0311370 A1* | 10/2015 | Chou | C08L 77/06 |
| | | | 136/251 |
| 2016/0329445 A1 | 11/2016 | Zhao | |
| 2017/0133537 A1* | 5/2017 | Liu | H01L 31/0516 |
| 2017/0148940 A1* | 5/2017 | Van Duijnhoven | C08J 5/18 |
| 2017/0200842 A1* | 7/2017 | Bonekamp | H01L 31/0481 |
| 2017/0243996 A1* | 8/2017 | Oderkerk | C08F 210/02 |
| 2018/0240924 A1* | 8/2018 | Hellstrom | B32B 27/08 |
| 2019/0027626 A1* | 1/2019 | Yoshimoto | B32B 27/22 |

FOREIGN PATENT DOCUMENTS

| | | |
|---|---|---|
| JP | 2014513431 A | 5/2014 |
| JP | 2015228423 | 12/2017 |
| WO | WO 2007/010706 | 1/2007 |
| WO | WO2011145599 A1 | 11/2011 |
| WO | WO2012029733 A1 | 3/2012 |

OTHER PUBLICATIONS

Written Opinion of the ISA for PCT/EP2017/079063 dated Feb. 12, 2018, 6 pages.

*HIFAX* CA 138 A, Technical Data Sheet, LyondellBasell Nov. 3, 2022.

* cited by examiner

BACKSHEET COMPRISING A POLYOLEFINE BASED FUNCTIONAL LAYER FACING THE BACK ENCAPSULANT

This application is the U.S. national phase of International Application No. PCT/EP2017/079063 filed Nov. 13, 2017 which designated the U.S. and claims priority to EP Patent Application No. 16198384.6 filed Nov. 11, 2016, the entire contents of each of which are hereby incorporated by reference.

The present invention relates to a backsheet for solar cell modules. The present invention in particular relates to a backsheet comprising a polyolefin based functional layer directly facing towards a back encapsulant. The present invention further relates to photovoltaic modules comprising the backsheet.

Solar cells or photovoltaic modules are used to generate electrical energy from sunlight. Photovoltaic modules are an important source of renewable energy. In particular, they include solar cells that release electrons when exposed to sunlight. These solar cells, which are usually semiconductor materials that may be fragile, are typically encapsulated in polymeric materials that protect them from physical shocks and scratches. The encapsulated solar cells are generally further protected by glass or by another outer layer that is resistant to weathering, abrasion or other physical insults.

Photovoltaic modules are traditionally mounted outdoors on rooftops or in wide-open spaces where their exposure to sunlight is maximized. When the intensity of sunlight increases, electrical output from photovoltaic modules also increases. However, the efficiency with which a photovoltaic module converts sunlight into electricity is usually only about 20%. The remaining about 80% of the sunlight is reflected back or absorbed by the module. Energy that is absorbed results in an increase of the operating temperature of the module. Excessive heat decreases the efficiency with which a photovoltaic module converts sunlight into electricity.

A solar cell module has a front surface protection sheet disposed on the side on which sunlight is incident, to protect the surface. This layer is for example a glass layer, which is a rigid outer layer that protects the PV cells and electronics from the environment while allowing light energy to pass through and be converted into electricity. The solar cell module also has a solar cell rear surface protection sheet called a backsheet, disposed on the opposite side to protect power generation cells.

The fragile solar cells are further protected by the use of so-called encapsulants. Encapsulants are used to provide adhesion between the solar cells, the front surface and the rear surface or backsheet of the PV module. Suitable polymer materials for solar cell encapsulants typically possess a combination of characteristics such as high impact resistance, high penetration resistance, good ultraviolet (UV) light resistance, good long term thermal stability, adequate adhesion strength to glass and/or other rigid polymeric sheets, high moisture resistance, and good long term weatherability. Examples of encapsulants are ionomers, ethylene vinyl acetate (EVA), poly(vinyl acetal), polyvinylbutyral (PVB), thermoplastic polyurethane (TPU), polyvinylchloride (PVC), metallocene-catalyzed linear low density polyethylenes, polyolefin block elastomers, poly(ethylene-co-methyl acrylate) and poly(ethylene-co-butyl acrylate), silicone elastomers or epoxy resins. EVA is the most commonly used encapsulant material. EVA sheets are usually inserted between the solar cells and the top surface (called front encapsulant) and between the solar cells and the rear surface (called a back encapsulant).

The backsheet is a photovoltaic laminate that protects the PV module from UV, moisture and weather while acting as an electrical insulator. The backsheet often comprises several polymeric layers to provide the above-mentioned properties and to minimize deterioration in the long-term performance of solar cell modules. The several polymeric layers have their own function in the backsheet. Normally a backsheet comprises a functional layer facing the cells, a structural reinforcement layer, a weather-resistant layer and adhesive layers between the functional layer and structural reinforcement layer and/or between structural reinforcement layer and weather-resistant layer. Examples of polymers used in the above-mentioned layers are polypropylene, polyvinylchloride, polyesters such as PET or PBT, fluoro-resins such as PTFE or PVDF and acrylic resins.

A backsheet comprising a polyolefine layer directly facing the back encapsulant is known in the art. These backsheets are for example disclosed in WO2014083604. WO2014083604 discloses a damp-heat resistant solar cell backsheet which consists of a weatherproof layer, a first connection layer, a structure reinforcement layer and a reflecting layer. The reflecting layer is facing the cells and comprises polyethylene, a copolymer containing ethylene chain segment —$CH_2$—$CH_2$—, an UV-resistant stabilizer and a white inorganic pigment. A disadvantage of the described backsheets comprising this reflecting layer based on polyethylene and a copolymer containing ethylene chain segment (—$CH_2$—$CH_2$—) is insufficient integrity during lamination causing too much shrinkage and hence stresses upon cooling after lamination which may lead to curling of the backsheet at the edges. Moreover these backsheets show a relatively low interlayer adhesion towards the adhesive layer which is attached to the structural reinforcement layer. Another disadvantage is the high oxygen transmission of polyethylene, which may lead to corrosion in the contacts in the PV module.

Aim of the present invention is to overcome the above-cited disadvantages.

The object of the present invention is achieved in that a solar cell backsheet is provided with a functional layer facing a back encapsulant wherein the functional layer comprises a polyethylene alloy and a semi-crystalline polymer with a melting point above 140° C.

It has been found that the integrity of above described backsheet during lamination is increased and thus provides reduced residual stresses and hence improved durability is achieved. Improved durability prevents formation of surface planarity defects such as curling or waving and prevents the formation of micro crack growth in silicon cells and in the solderings. It has moreover been found that the addition of the semi-crystalline polymer in the functional layer improves the interlayer adhesion towards the adhesive layer, which is attached to the structural reinforcement layer. Surprisingly the adhesion of the functional layer comprising the semi-crystalline polymer, to the back encapsulant remains good.

During lamination of PV modules usually the backsheet protrudes the PV module stack that is positioned on the belt in the laminator with the AR-coated glass facing the belt. When at high temperature pressure is being applied on the stack, the backsheet may be pressed against the belt and hence the functional layer layer touches the belt. When the adhesion between the functional layer and the structural layer is too low, parts of the functional layer will remain on the belt contaminating the front side of the AR-coated glass in a next lamination cycle. Such contaminations need to be removed and may damage the AR coating during cleaning. Increased adhesion between the structural and functional layer prevent this contamination and cleaning is not needed preventing the AR-coating to be damaged.

The semi-crystalline polymer is preferably selected from the group consisting of polyolefines, polyamides, or polyesters.

Examples of semi-crystalline polyolefins are for example polyethylene, polypropylene homo- and copolymers, maleic anhydride grafted polypropylene and/or polybutylene, with polypropylene copolymers being the most preferred.

In case of polypropylene copolymers, propylene is the main monomer unit which may contain other alpha-olefins, such as ethylene and butene-1. These polypropylenes may be obtained using either Zieger-Natta or metallocene catalysts.

By the term "semi-crystallinity" it is understood that the polymer has a crystallinity typically ranging between 10 and 80%. Preferably the crystallinity of the polymer is greater than 30%. The assessment of a polymer's crystallinity can be most easily performed using differential scanning calorimetry (DSC) which measures the heat flow into or from a sample as it is either heated, cooled or under isothermally. The Pyris 6, DSC from PerkinElmer for example provides a means of measuring the percent crystallinity of thermoplastic materials. DSC measurement is well known in the art.

Regardless of how the degree of crystallinity of the crystalline polypropylene is measured, it is the polymers' properties that will determine whether a given polymer is "semi-crystalline" as the term is used herein. The first property is melting point. In cases where the semi-crystalline polypropylenes are prepared using a Ziegler-Natta catalyst, they may have a melting point above 140° C. Preferably, the melting point is above 145° C., most preferably the melting point is between 150 and 170° C. The second determining property is heat of fusion. When the polypropylenes are Ziegler-Natta derived polymers, they may have a heat of fusion of at least 100 Joules/g, at least 115 Joules/g or at least 120 Joules/g. Heat of fusion is determined using a differential scanning calorimeter and a method such as is described in ASTM D-3417-99 wherein a 5 to 10 mg sample is heated and cooled at a rate of 10 degrees centigrade.

If the semi-crystalline polypropylene is obtained by using a metallocene catalyst, the polypropylene will have a melting point of at least about 158° C. and a heat of fusion of at least 90 Joules/g. As for Ziegler-Natta derived polypropylenes, the crystalline properties of the metallocene catalyzed polypropylenes may also be assessed using DSC. Examples of semi-crystalline polypropylenes useful in the present invention are 3270 9119 from ATOFINA™, BP™ Accpro 9346, BASELLADSTIF™ HA722J, Sinopec K8003 and SUNOCO™ PPF-050-HC.

The functional layer comprises at least 5 wt % of the semi-crystalline polymer, preferably at least 10 wt % of the semi-crystalline polymer based on the total weight of the polymers in the functional layer. More preferably, the functional layer comprises between 10-49 wt % of the semi-crystalline polymer based on the total weight of the polymers in the functional layer.

The polyethylene (PE) alloy or blend in the functional layer of the present invention preferably comprises polyethylene and a "polar" polyethylene. A polar polyethylene means for example ethylene copolymerized with polar co-monomers chosen from vinyl acetate, acrylic and methacrylic ester such as methylacrylate, ethylacrylate, butylacrylate or ethylhexylacrylate. Preferably, the polyethylene (PE) alloy is a blend of polyethylene and an ethylene-methacrylate copolymer and/or ethylene-vinylacetate copolymer.

Semi-crystalline polyamides have a high dimensional stability under heat, a lower absorption of water, improved stability to hydrolysis and increased dimensional stability under the action of moisture. Low moisture uptake guarantees good electrical insulation also in high humidity environments. Examples of semi-crystalline polyamides are polyamide 6; polyamide 6,6; polyamide 4,6; polyamide 4,10, polyamide 6,10; polyamide 6,12; polyamide 6,14; polyamide 6,13; polyamide 6,15; polyamide 6,16; polyamide 11; polyamide 12; polyamide 10; polyamide 9,12; polyamide 9,13; polyamide 9,14; polyamide 9,15; polyamide 6,16; polyamide 10,10; polyamide 10,12; polyamide 10,13; polyamide 10,14; polyamide 12,10; polyamide 12,12; polyamide 12,13; polyamide 12,14; adipamide polyethylene terephthalate, polyethylene terephthalate azelaic acid amide, polyethylene sebacic acid amide, polyethylene terephthalate twelve diamide, adipic adipamide/terephthalic adipamide copolyamide, adipamide terephthalate/isophthalate copolymerized adipamide amide, m-xylene polyadipates amide, terephthalic acid adipamide/terephthalic acid methyl glutaramido, adipic adipamide/terephthalate adipamide/isophthalate copolyamides adipamide, polycaprolactam-terephthalate adipamide. polyamide 12 and any mixtures thereof. Preferred polyamides are selected with limited moisture uptake such as polyamide 11, 12 or 4,10.

Examples of semi-crystalline polyesters include poly (trans-1,4-cyclohexylene alkane dicarboxylates such as poly (trans-1,4-cyclohexylene succinate) and poly(trans-1,4-cyclohexylene adipate), poly(cis or trans-1,4-cyclohexanedimethylene), alkanedicarboxylates such as poly(cis 1,4-cyclohexanedimethylene)oxalate and poly(cis 1,4-cyclohexanedimethylene)succinate, poly(alkylene terephthalates) such as polyethyleneterephthalate and polytetramethyleneterephthalate, poly(alkylene isophthalates such as polyethyleneisophthalate and polytetramethyleneisophthalate, poly(p-phenylene alkanedicarboxylates such as poly (p-phenylene glutarate) and poly(p-phenylene adipate), poly (p-xylene oxalate), poly(o-xylene oxalate), poly(p-phenylenedialkylene terephthalates) such as poly(p-phenylenedimethylene terephthalate) and poly(p-phenylene-di-1,4-butylene terephthalate, poly(alkylene-1,2-ethylenedioxy-4,4'-dibenzoates) such as poly(ethylene-1,2-ethylenedioxy-4,4'-dibenzoates), poly(tetramethylene-1,2-ethylenedioxy-4,4'-dibenzoate) and poly(hexamethylene-1,2-ethylenedioxy-4,4'-dibenzoate), poly(alkylene-4,4'-dibenzoates) such as poly(pentamethylene-4,4'-dibenzoate), poly(hexamethylene-4,4'-dibenzoate and poly(decamethylene-4,4'-dibenzoate), poly(alkylene-2,6-naphthalene dicarboxylates) such as poly(ethylene-2,6-naphthalene dicarboxylates), poly(trimethylene-2,6-naphthalene dicarboxylates) and poly(tetramethylene-2,6-naphthalene dicarboxylates), and poly(alkylene sulfonyl-4,4'-dibenzoates) such as poly(octamethylene sulfonyl-4,4'-dibenzoate) and poly-(decamethylene sulfonyl-4,4'-dibenzoate. Preferred polyesters are poly(alkylene terephthalates) such as polyethylene terephthalate (PET) or polybutylene terephthalate (PBT).

The functional layer according to the present invention may further comprise an inorganic filler and other additives. Examples of these inorganic fillers are calcium carbonate, titanium dioxide, barium sulfate, mica, talc, kaolin, ZnO, ZnS, glass microbeads and glass fibers. When such fillers are used, the functional layer comprises from 0.05-20 wt. % of filler based on the total weight of the polymers in the functional layer, preferably the functional layer comprises from 5-15 wt. % of filler based on the total weight of the polymers in the functional layer. Example of the additives are selected from UV stabilizers, UV absorbers, anti-oxidants, thermal stabilizers and/or hydrolysis stabilisers. When such stabilizers are used, the functional layer comprises from 0.05-10 wt. % more preferably to 5 wt. % additives based on the total weight of the polymers in the functional layer.

White pigments such as TiO2, ZnO or ZnS may be added to the functional layer to increase backscattering of sunlight leading to increased efficiency of the solar module. Black pigments such as carbon black may also be added for esthetic reasons.

The solar backsheet according to the present invention may further comprise other layers such as a structural reinforcement layer and/or a weather-resistant layer. The structural reinforcement layer and/or the weather-resistant layer may further comprise inorganic fillers or additives as referred to in above mentioned paragraphs.

The solar backsheet according to the present invention may further comprise an adhesive layer, which may be arranged between the functional layer and the structural reinforcement layer and/or between the structural reinforcement layer and the weather resistant layer. The adhesive layer for example comprises a maleic anhydride grafted polyolefine such as maleic anhydride grafted polyethylene or maleic anhydride grafted polypropylene, an ethylene-acrylic acid copolymer or an ethylene-acrylic ester-maleic anhydride terpolymer. Preferably, the adhesive layer comprises maleic anhydride grafted polyolefine such as a maleic anhydride grafted polyethylene or a maleic anhydrate grafted polypropylene.

The weather-resistant layer comprises for example a polyamide or fluoro-resin such as PTFE or PVDF. The polyamide is for example selected from one or more of the following materials: polyamide 6, polyamide 6,6; polyamide 4,6; polyamide 4,10, polyamide 6,10; polyamide 6,12; polyamide 6,14; polyamide 6,13; polyamide 6,15; polyamide 6,16; polyamide 11; polyamide 12, polyamide 10, polyamide 9,12, polyamide 9,13, polyamide 9,14, polyamide 9,15, polyamide 6,16, polyamide 10,10, polyamide 10,12, polyamide 10,13, polyamide 10,14, polyamide 12,10, polyamide 12,12, polyamide 12,13, polyamide 12,14, adipic adipamide/terephthalic adipamide copolyamide, terephthalic adipamide/isophthalic adipamide copolyamide, poly(adipic acid meta-dimethylbenzamide), terephthalic adipamide/terephthalic 2-methylglutaramide, adipic adipamide/terephthalic adipamide/isophthalic adipamide copolyamide and polycaprolactam-terephthalic adipamide. The weather-resistant layer may further comprise titanium dioxide or barium sulfate, a UV stabilizer and a heat stabilizer.

The structural reinforcement layer for example comprises an engineering plastic such as polypropylene or a blend of polypropylene or modified polypropylene, a polyester such as PET or a polyamide as described above.

The backsheet of the present invention comprising the structural reinforcement layer and/or the weather-resistant layer and/or the adhesive layer may further comprise an inorganic filler and other additives. Examples of fillers and additives and possible amounts are described above.

The solar backsheet according to the present invention may be prepared using a multi-layer co-extrusion process. The process comprises the following steps of compounding the individual formulations of the functional layer and other layers such as structural reinforcement layer and/or weather resistant layer and/or adhesive layer including inorganic fillers, additives and stabilizers followed by extrusion of the different layers and laminating them.

Alternatively the solar backsheet according to the present invention may also be manufactured by the following methods:

A first method includes the following steps: (1) pelletizing a weatherproof layer material, an adhesive layer material, a structure reinforcement layer material and a functional layer material respectively in an extruder to obtain weatherproof layer plastic particles, adhesion layer plastic particles, structure reinforcement layer plastic particles and functional layer plastic particles and (2) fusing and co-extruding the weatherproof layer plastic particles, the adhesive layer plastic particles, the structure reinforcement layer plastic particles and the functional layer plastic particles prepared in step (1) into a multilayer co-extruded film.

Another method includes the following steps: (1) pelletizing an adhesive layer material, a structure reinforcement layer material and a functional layer material respectively in an extruder to obtain adhesion layer plastic particles, structure reinforcement layer plastic particles and functional layer plastic particles and (2) fusing and co-extruding the adhesion layer plastic particles, the structure reinforcement layer plastic particles and the functional layer plastic particles prepared in step (1) through the extruder, and extrusion laminating the coextruded multilayer film on the weatherproof layer.

Also possible is that the backsheet is obtained by extruding the separate layers of the backsheet and laminating the layers with an adhesive such as an epoxy, acrylate or polyurethane adhesive.

The present invention also relates to a photovoltaic module comprising the solar backsheet according to the present invention. A photovoltaic module (abbreviated PV module) comprises at least the following layers in order of position from the front sun-facing side to the back non-sun-facing side: (1) a transparent pane (representing the front sheet), (2) a front encapsulant, (3) a solar cell layer, (4) a back encapsulant and (5) the back sheet according to the present invention.

The front sheet is typically either a glass plate or in case of flexible modules, a layer from fluorinated polymers like ETFE (ethylene tetrafluorethylene) or PVDF (polyvinylidene fluoride).

The present invention further relates to a process for preparing such solar cell module, which process comprises (a) providing an assembly comprising one or more polymer layers recited above and (b) laminating the assembly to form the solar cell module. The laminating step of the process may be conducted by subjecting the assembly to heat and optionally vacuum or pressure.

The invention is now demonstrated by means of a series of examples and comparative experiments.

EXAMPLES

Method for Manufacturing a Lower Solar Backplate Comprises the Following Steps:

Material of a weathering-resistant layer, an adhesive layer, a structure reinforcing layer and a functional layer are respectively pelletized by an extruder to obtain plastic pellets of respective layers.

A back sheet is prepared by a multilayer co-extrusion process whereby the pellets of the respective layers are added to multiple extruders, melt-extruded at a high temperature, flow through an adapter and a die, cooled by a cooling roller and shaped to manufacture the multi-layer back sheet. Composition of the different layers in the multilayer backsheets are given in table 1.

Measurements

Peel strength is measured between the functional layer and the structure reinforcing layer and between the functional layer and EVA as encapsulant Aging is measured: Appearance after ageing (121° C., 100% humidity) in an HAST high pressure accelerated ageing test machine for 48 hours.

Appearance and yellowing are measured after ageing by 120 KWH ultraviolet radiation.

Results of these measurements for the multilayer backsheets of comparative examples I and II and for examples 1-5 are given in table 2.

Comparative Example I (CE-I)

A PVDF fluorine polymer is used as a weathering-resistant layer, a blend of polymers of maleic anhydride grafted polypropylene and EMA ethylene methyl acrylate is used as an adhesive layer which can adhere both the fluorine polymer and the maleic anhydride grafted polypropylene. No semi-crystalline polymer is added to the functional layer.

Comparative Example II (CE-II)

A nylon 12 (PA12) polymer is used as a weathering-resistant layer, maleic anhydride grafted polypropylene is used as an adhesive layer. No semi-crystalline polymer is added to the functional layer.

Examples 1-4

A semi-crystalline polymer such as polypropylene or maleic anhydride grafted polypropylene is added to the functional layer in Examples 1-4, respectively.

TABLE 1

| Multilayer backsheet | Weather-resistant layer (thickness) | Adhesive layer (thickness) | Structure reinforcing layer (thickness) | Adhesive layer (thickness) | Functional layer (thickness) |
|---|---|---|---|---|---|
| CE-I | 80 parts of PVDF, 15 parts of PMMA and 5 parts of TiO$_2$, blended (25 μm) | 50 parts of maleic anhydride grafted polypropylene and 50 parts of ElvaloyAC1224 (25 μm) | 90 parts of copolymerized PP, 10 parts of TiO$_2$ and 0.3 parts of Irganox 1010, blended (250 μm) | 50 parts of maleic anhydride grafted polypropylene and 50 parts of ElvaloyAC1224 (25 μm) | 70 parts of LLDPE, 20 parts of EVA, 10 parts of TiO$_2$ and 0.5 parts of an ultraviolet stabilizer, blended (50 μm) |
| CE-II | 100 parts of PA12, 0.5 parts of Tinuvin770, 0.3 parts of Irganox B225 and 10 parts of TiO$_2$, blended (25 μm) | 100 parts of maleic anhydride grafted polypropylene (25 μm) | 90 parts of copolymerized PP, 10 parts of TiO$_2$ and 0.3 parts of Irganox 1010, blended (250 μm) | 100 parts of maleic anhydride grafted polypropylene (25 μm) | 70 parts of LLDPE, 20 parts of EVA, 10 parts of TiO$_2$ and 0.5 parts of an ultraviolet stabilizer, blended (50 μm) |
| Example 1 | 100 parts of PA12, 0.5 parts of Tinuvin770, 0.3 parts of Irganox B225 and 10 parts of TiO$_2$, blended (25 μm) | 100 parts of maleic anhydride grafted polypropylene (25 μm) | 90 parts of copolymerized PP, 10 parts of TiO$_2$ and 0.3 parts of Irganox 1010, blended (250 μm) | 100 parts of maleic anhydride grafted polypropylene (25 μm) | 65 parts of LLDPE, 20 parts of EVA, 5 parts of copolymerized PP, 10 parts of TiO$_2$ and 0.5 parts of an ultraviolet stabilizer, blended (50 μm) |
| Example 2 | 100 parts of PA12, 0.5 parts of Tinuvin770, 0.3 parts of Irganox B225 and 10 parts of TiO$_2$, blended (25 μm) | 100 parts of maleic anhydride grafted polypropylene (25 μm) | 90 parts of copolymerized PP, 10 parts of TiO$_2$ and 0.3 parts of Irganox 1010, blended (250 μm) | 100 parts of maleic anhydride grafted polypropylene (25 μm) | 60 parts of LLDPE, 20 parts of EVA, 10 parts of copolymerized PP, 10 parts of TiO$_2$ and 0.5 parts of an ultraviolet stabilizer, blended (50 μm) |
| Example 3 | 100 parts of PA12, 0.5 parts of Tinuvin770, 0.3 parts of | 100 parts of maleic anhydride grafted polypropylene | 90 parts of copolymerized PP, 10 parts of TiO$_2$ and 0.3 parts of | 100 parts of maleic anhydride grafted polypropylene | 55 parts of LLDPE, 20 parts of EVA, 15 parts of copolymerized |

TABLE 1-continued

| Multilayer backsheet | Weather-resistant layer (thickness) | Adhesive layer (thickness) | Structure reinforcing layer (thickness) | Adhesive layer (thickness) | Functional layer (thickness) |
|---|---|---|---|---|---|
| | Irganox B225 and 10 parts of TiO$_2$, blended (25 μm) | (25 μm) | Irganox 1010, blended (250 μm) | (25 μm) | PP, 10 parts of TiO$_2$ and 0.5 parts of an ultraviolet stabilizer, blended (50 μm) |
| Example 4 | 100 parts of PA12, 0.5 parts of Tinuvin770, 0.3 parts of Irganox B225 and 10 parts of TiO$_2$, blended (25 μm) | 100 parts of maleic anhydride grafted polypropylene (25 μm) | 90 parts of copolymerized PP, 10 parts of TiO$_2$ and 0.3 parts of Irganox 1010, blended (250 μm) | 100 parts of maleic anhydride grafted polypropylene (25 μm) | 55 parts of LLDPE, 20 parts of EVA, 15 parts of maleic anhydride grafted PP, 10 parts of TiO$_2$ and 0.5 parts of an ultraviolet stabilizer, blended (50 μm) |

In Table 1, the respective layers are multi-component layers and the proportion of each component is in parts by weight.

Elvaloy AC1224 is a copolymer of ethylene and methyl acrylate from DuPont;

TABLE 2

| RESULTS | Peeling strength between functional layer and structure reinforcing layer (N/cm) | Peeling strength between functional layer and encapsulation layer (N/cm) | Peeling strength after ageing (120° C., 100% humidity) of 48 hours in HAST | Ultraviolet ageing resistance of functional layer (yellowing after 120 KWH radiation) |
|---|---|---|---|---|
| Comparative Example I | 34 | 74.5 | No layering or cracking is seen | 0.5 |
| Comparative Example II | 36 | 72.6 | No layering or cracking is seen | 0.4 |
| Example 1 | >40 (Unpeelable) | 65.3 | No layering or cracking is seen | 0.3 |
| Example 2 | >40 (Unpeelable) | 68.8 | No layering or cracking is seen | 0.5 |
| Example 3 | >40 (Unpeelable) | 66.8 | No layering or cracking is seen | 0.5 |
| Example 4 | >40 (Unpeelable) | 68.8 | No layering or cracking is seen | 0.7 |

It can be seen from the data in Table 2 that the addition of 5-15 parts of polypropylene (PP) to the functional layer, results in remarkably improved adhesion force between the functional layer and the structural reinforcing layer, while the adhesion force between the functional layer and the EVA encapsulation layer is reduced slightly. The adhesion force between the functional layer and the structural reinforcing layer increases by the addition of 10 parts by weight of polypropylene PP and 15 parts by weight of maleic anhydride grafted polypropylene (MPP). It can be seen from the test results of HAST and ultraviolet ageing resistance that the addition of polypropylene or maleic anhydride grafted polypropylene in the functional layer has little effect on the hydrolysis resistance and ultraviolet ageing resistance.

As can be seen from Tables 1 and 2, the adhesion forces between the functional layers and the structural reinforcing layers in the backsheets of Examples 1-4 are remarkably improved with respect to that of the backsheets of Comparative Examples I and II. Furthermore, the peeling strengths to the encapsulation layers can also be maintained at a good level, there is no weak point in terms of the adhesion forces between the backsheet layers and the adhesion forces to the encapsulation layers which means that the overall durability of the backsheets is improved.

The invention claimed is:

1. A solar cell backsheet comprising:
   a functional layer facing a back encapsulant, and
   a structural reinforcement layer adhered to the functional layer, wherein
   the functional layer comprises a blend of:
   (i) a polyethylene alloy comprising a polyethylene and an ethylene-vinyl acetate (EVA) copolymer and/or an ethylene-methacrylate (EMA) copolymer, and
   (ii) a semi-crystalline polypropylene polymer with a melting point above 140° C. selected from the group consisting of polypropylene homopolymer, polypropylene copolymer and maleic anhydride grafted polypropylene, and wherein the structural reinforcement layer comprises a layer selected from the group consisting of polypropylene, modified polypropylene, maleic anhydride grafted polypropylene and blends thereof, and wherein the semi-crystalline polypropylene polymer is present in the functional layer in an amount of 5-15 wt. %, based on total weight of polymers in the functional layer, sufficient to achieve a peel strength between the functional layer and the structural reinforcement layer of greater than 40 N/cm.

2. The solar cell backsheet according to claim 1, wherein the functional layer further comprises an inorganic filler.

3. The solar cell backsheet according to claim 2, wherein the inorganic filler is at least one selected from the group consisting of calcium carbonate, titanium dioxide, barium sulfate, mica, talc, kaolin, glass microbeads and glass fibers.

4. The solar cell backsheet according to claim 1, further comprising a weather-resistant layer and/or an adhesive layer.

5. The solar cell backsheet according to claim 4, wherein the weather-resistant layer comprises a fluoro-resin or a polyamide.

6. The solar cell backsheet according to claim 4, wherein the adhesive layer comprises a maleic anhydride grafted polyolefin.

7. The solar cell backsheet according to claim 4, wherein the weather-resistant layer and/or the adhesive layer further comprise an inorganic filler.

8. The solar cell backsheet according to claim 1, wherein the polyethylene of the polyethylene alloy comprises linear low density polyethylene (LLDPE).

9. The solar cell backsheet according to claim 1, further comprising an adhesive layer between the functional layer and the structural reinforcement layer.

10. The solar cell backsheet according to claim 9, wherein the adhesive layer comprises maleic anhydride grafted polyethylene or maleic anhydride grafted polypropylene.

11. A photovoltaic module comprising the backsheet according to claim 1.

* * * * *